United States Patent
Matsumura et al.

(10) Patent No.: US 8,922,232 B2
(45) Date of Patent: Dec. 30, 2014

(54) TEST-USE INDIVIDUAL SUBSTRATE, PROBE, AND SEMICONDUCTOR WAFER TESTING APPARATUS

(75) Inventors: Shigeru Matsumura, Saitama (JP); Kohei Kato, Gunma (JP); Katsushi Sugai, Saitama (JP); Koichi Shiroyama, Saitama (JP); Mitsutoshi Higashi, Nagano (JP); Akinori Shiraishi, Nagano (JP); Hideaki Sakaguchi, Nagano (JP)

(73) Assignees: Advantest Corporation, Tokyo (JP); Shinko Electric Industries Co., Ltd., Nagano (JP)

( * ) Notice: Subject to any disclaimer, the term of this patent is extended or adjusted under 35 U.S.C. 154(b) by 127 days.

(21) Appl. No.: 13/212,585

(22) Filed: Aug. 18, 2011

(65) Prior Publication Data
US 2012/0049876 A1    Mar. 1, 2012

(30) Foreign Application Priority Data
Aug. 30, 2010 (JP) .................................. 2010-192038

(51) Int. Cl.
*G01R 31/00* (2006.01)
*G01R 1/073* (2006.01)

(52) U.S. Cl.
CPC .................................. *G01R 1/07307* (2013.01)
USPC ............ 324/755.07; 324/756.03; 324/755.09; 324/755.08; 324/754.18

(58) Field of Classification Search
CPC ........... G01R 1/07378; G01R 31/2889; G01R 31/2886; G01R 1/06716
USPC ........................... 324/755.09, 754.11, 755.07
See application file for complete search history.

(56) References Cited

U.S. PATENT DOCUMENTS

| | | | | |
|---|---|---|---|---|
| 3,867,698 A * | 2/1975 | Beltz et al. | ........ | 324/755.07 |
| 4,961,052 A * | 10/1990 | Tada et al. | ........ | 324/756.03 |
| 6,181,150 B1 * | 1/2001 | Okuno | ........ | 324/756.03 |
| 6,358,762 B1 | 3/2002 | Kohno | | |
| 6,507,204 B1 * | 1/2003 | Kanamaru et al. | ........ | 324/755.07 |
| 6,864,695 B2 * | 3/2005 | Kohno et al. | ........ | 324/754.03 |
| 6,998,857 B2 * | 2/2006 | Terada et al. | ........ | 324/756.03 |
| 7,330,037 B2 * | 2/2008 | Koizumi et al. | ........ | 324/755.01 |
| 7,471,094 B2 * | 12/2008 | Hobbs et al. | ........ | 324/750.22 |
| 7,474,111 B2 * | 1/2009 | Narita | ........ | 324/756.03 |
| 2009/0206861 A1 | 8/2009 | Shiraishi | | |

FOREIGN PATENT DOCUMENTS

| | | |
|---|---|---|
| JP | 9-330995 | 12/1997 |
| JP | 2001-091543 | 4/2001 |
| JP | 2011-091544 | 4/2001 |

(Continued)

OTHER PUBLICATIONS

Korea Office action, mail date is Oct. 23, 2012.

(Continued)

*Primary Examiner* — Richard Isla Rodas
(74) *Attorney, Agent, or Firm* — Greenblum & Bernstein, P.L.C.

(57) ABSTRACT

[Problems to be solved] To provide a test-use individual substrate capable of improving testing accuracy and connecting reliability.
[Means for solving the Problems] A test-use individual substrate 30 which is used for testing a semiconductor wafer, comprises a main body portion 31, thin portions 321, 322 extending from the main body portion 31 and being relatively thinner than the main body portion, and bumps 33 provided on the thin portions 321, 322.

12 Claims, 18 Drawing Sheets

(56) References Cited

FOREIGN PATENT DOCUMENTS

| | | |
|---|---|---|
| JP | 2002-340932 | 11/2002 |
| JP | 2006-507512 | 3/2006 |
| JP | 2009-192309 | 8/2009 |
| JP | 2009-293943 | 12/2009 |
| WO | 2004/049429 | 6/2004 |

OTHER PUBLICATIONS

Japan Office action, mail date is Jul. 17, 2012.
Japan Office action, mail date is Dec. 18, 2012.

* cited by examiner

TEST-USE INDIVIDUAL SUBSTRATE, PROBE, AND SEMICONDUCTOR WAFER TESTING APPARATUS

TECHNICAL FIELD

The present disclosure relates to a test-use individual substrate which is used for testing electronic devices (hereinafter also referred to as DUTs (Devices Under Test), such as integrated circuit devices formed in a semiconductor wafer, and a probe and a semiconductor wafer testing apparatus which comprise the test-use individual substrate.

It is to be noted that the contents described and/or illustrated in the document relevant to Japanese Patent Application No. 2010-192038 filed on Aug. 30, 2010 will be incorporated herein by reference, as a part of the description and/or drawings of the present application.

BACKGROUND ART

As a probe which is used for testing DUTs in the state of wafer, a probe is known which comprises a membrane, a first anisotropic conductive rubber, a first wiring board, a second anisotropic conductive rubber, and a second wiring board (refer to Patent Document 1, for example).

In this probe of five-layer structure, the first anisotropic conductive rubber is interposed between the membrane and the first wiring board, and the second anisotropic conductive rubber is interposed between the first wiring board and the second wiring board.

These anisotropic conductive rubbers ensure pressing forces for establishing electrical conductivity between the membrane and the first wiring board and electrical conductivity between the first wiring board and the second wiring board, and absorb positional errors of the semiconductor wafer, the membrane, the first wiring board, and the second wiring board.

PRIOR ART DOCUMENT

Patent Document

[Patent Document 1] Japanese Published Patent Application No. 2009-293943

SUMMARY OF THE INVENTION

Problems to be Solved by the Invention

The above probe involves a problem that the number of layers in the probe increases because the anisotropic conductive rubbers interpose therein. As the number of layers in a probe increases, the transmission path from a test head to DUTs in a semiconductor wafer necessarily comes to be long, thereby it is difficult to test in higher accuracy. Further, the above probe involves a problem of deteriorating the reliability of connections because increase in the number of layers in a probe requires connecting points on the transmission path to increase.

Means for Solving the Problems

Problems to be solved by the present invention include providing a test-use individual substrate, a probe, and a semiconductor wafer testing apparatus which enable to improve testing accuracy and connecting reliability.

The test-use individual substrate according to the present invention is a test-use individual substrate which is used for testing a semiconductor wafer, and comprises: a main body portion; a thin portion which extends from the main body portion and which is relatively thinner than the main body portion; and a contact portion which is provided on the thin portion (refer to claim 1).

In the above invention, the test-use individual substrate may comprise a projecting portion which is provided on an opposite surface of the thin portion which is opposite to a surface of the thin portion on which the contact portion is provided.

In the above invention, the projecting portion may be provided on the opposite surface of the thin portion at a position corresponding to the contact portion.

In the above invention, the thin portion may connect to the main body portion at one end of the thin portion, and other end of the thin portion may be a free end (refer to claim 2).

In the above invention, the contact portion may be placed at the other end of the thin portion or in the vicinity of the other end of the thin portion (refer to claim 3).

In the above invention, the test-use individual substrate may comprise a plurality of the contact portions, and the thin portion may have a slit formed between the contact portions (refer to claim 4).

In the above invention, the thin portion may connect to the main body portion at both ends of the thin portion (refer to claim 5).

In the above invention, the contact portion may be placed at a middle of the thin portion or in the vicinity of the middle of the thin portion (refer to claim 6).

In the above invention, the test-use individual substrate may comprise a plurality of the contact portions, and the thin portion may have a slit formed between the contact portions (refer to claim 7).

In the above invention, the test-use individual substrate may further comprise: a first interconnection which is connected to the contact portion; a first penetrating electrode which is connected to the first interconnection and which penetrates the main body portion from one main surface of the main body portion to the other main surface of the main body portion, and a first pad which is provided on the other main surface of the main body portion and which is connected to the first penetrating electrode (refer to claim 8).

The probe according to the present invention comprises: the above test-use individual substrates; and a main board on which the test-use individual substrates are mounted (refer to claim 9).

In the above invention, one of the test-use individual substrates may correspond to one electronic device of a plurality of electronic devices formed in the semiconductor wafer (refer to claim 10).

In the above invention, the main board may comprise: a second pad which is provided on one main surface of the main board and on which the test-use individual substrate is mounted; a second penetrating electrode which is connected to the second pad and which penetrates the main board from the one main surface of the main board to other main surface of the main board; a second interconnection which is provided on the other main surface of the main board and which is connected to the second penetrating electrode; and a third pad which is connected to the second interconnection (refer to claim 11).

In the above invention, the probe may further comprise a wiring board on which the main board is stacked, the wiring board may have a fourth pad at a position corresponding to the third pad of the main board, and a connecting member which is elastically deformable and has conductivity is interposed between the third pad and the fourth pad (refer to claim 12).

The semiconductor wafer testing apparatus according to the present invention is a semiconductor wafer testing apparatus for testing a semiconductor wafer, and comprises: the above probe; a testing apparatus main body which is electrically connected to the probe; and a connecting device which electrically connects the contact portion of the probe and an electrode of the semiconductor wafer (refer to claim 13).

Advantageous Effect of the Invention

According to the present invention, the test-use individual substrate has the thin portion, and this thin portion bends when pressing thereby it is possible to ensure elasticity. Due to this, no anisotropic conductive rubber is necessary to the probe and it is also possible to reduce the number of layers in the probe, thereby improving the test accuracy and the connection reliability.

EMBODIMENTS FOR CARRYING OUT THE INVENTION

Hereinafter, embodiments in the present invention will be described with reference to the drawings.

First Embodiment

Figure 1:
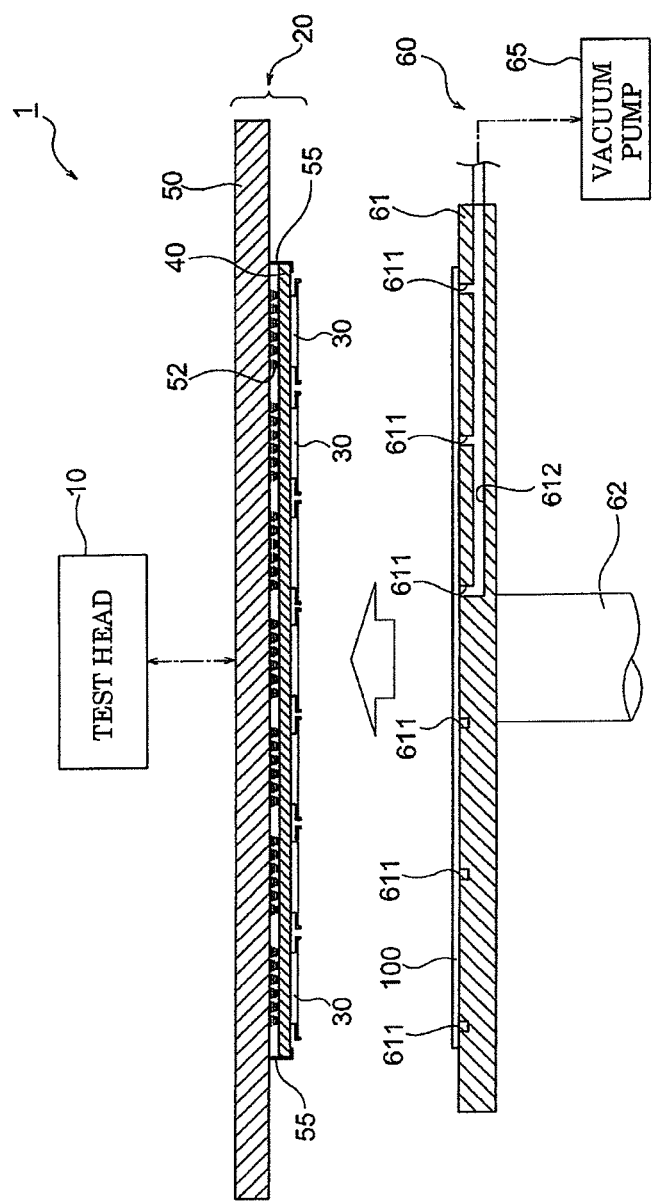
FIG. 1 is a schematic cross-sectional view illustrating a semiconductor wafer testing apparatus in the first embodiment of the present invention.
Figure 2:
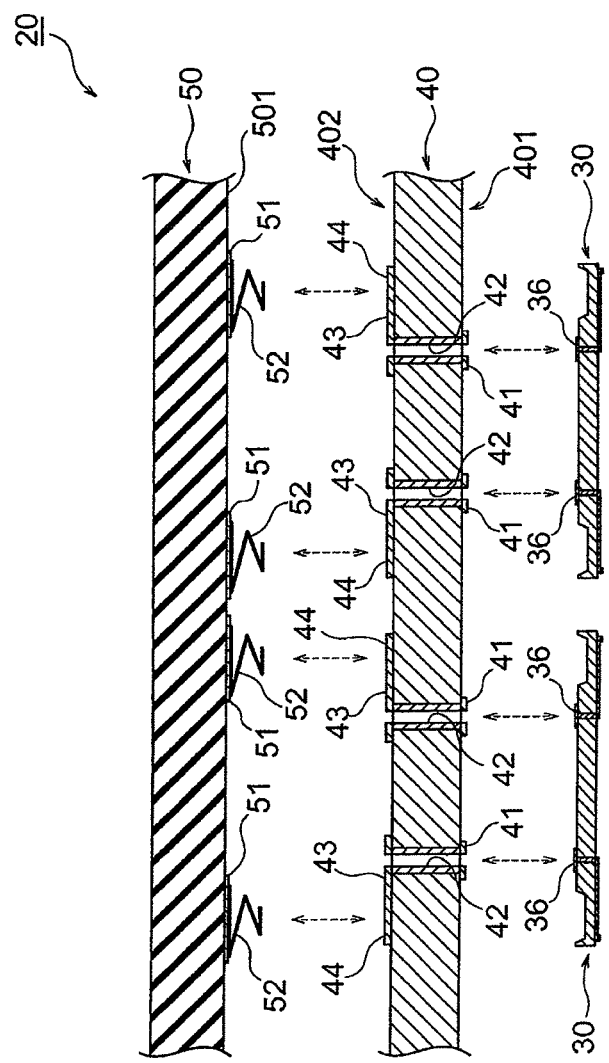
FIG. 2 is an exploded cross-sectional view of a probe in the first embodiment of the present invention.

FIG. 1 is a view illustrating a semiconductor wafer testing apparatus in the first embodiment of the present invention, and FIG. 2 is a view illustrating a probe in the present embodiment.

The semiconductor wafer testing apparatus 1 is an apparatus which tests electrical properties of DUTs formed in a semiconductor wafer 100, and comprises a test head 10, a probe 20 (probe card), and a moving apparatus 60, as shown in FIG. 1. Note that the semiconductor wafer testing apparatus as will be described hereinafter is illustrative only, and the present invention is not particularly limited to this.

This semiconductor wafer testing apparatus 1, at the time of testing DUTs, causes the semiconductor wafer 100 held on a stage 61 of the moving apparatus 60 to face the probe 20, and the stage 61 is further lifted up from this status by an arm 62 of the moving apparatus 60. Due to this, the semiconductor wafer 100 is pressed against the probe 20. Then, testing signals are input and output between the test head 10 and DUTs, thereby performing test for DUTs.

Note that the semiconductor wafer 100 and the probe 20 may be contacted with each other by a method other than the pressing method (e.g. a decompression method in which a ring-like sealing member is interposed to form an enclosed space between the probe 20 and the stage 61, and the air pressure in the enclosed space is reduced thereby approximating the semiconductor wafer 100 to the probe 20). The moving apparatus 60 in the present embodiment or the above decompression mechanism is equivalent to one example of the connecting device in the present invention.

As shown in FIG. 1 and FIG. 2, the probe 20 in the present embodiment comprises: probe chips 30 for electrically contacting with electrodes 110 (refer to FIG. 11) of DUTs formed in the semiconductor wafer 100; a performance board 50 electrically connected to the test head 10; and a pitch converting board 40 on which the probe chips 30 are mounted and which is stacked on the performance board 50.

Note that each probe chip 30 in the present embodiment is equivalent to one example of the test-use individual substrate in the present invention, the pitch converting board 40 in the present embodiment is equivalent to one example of the main board in the present invention, and the performance board 50 in the present embodiment is equivalent to one example of the wiring board in the present invention.

Figure 3:
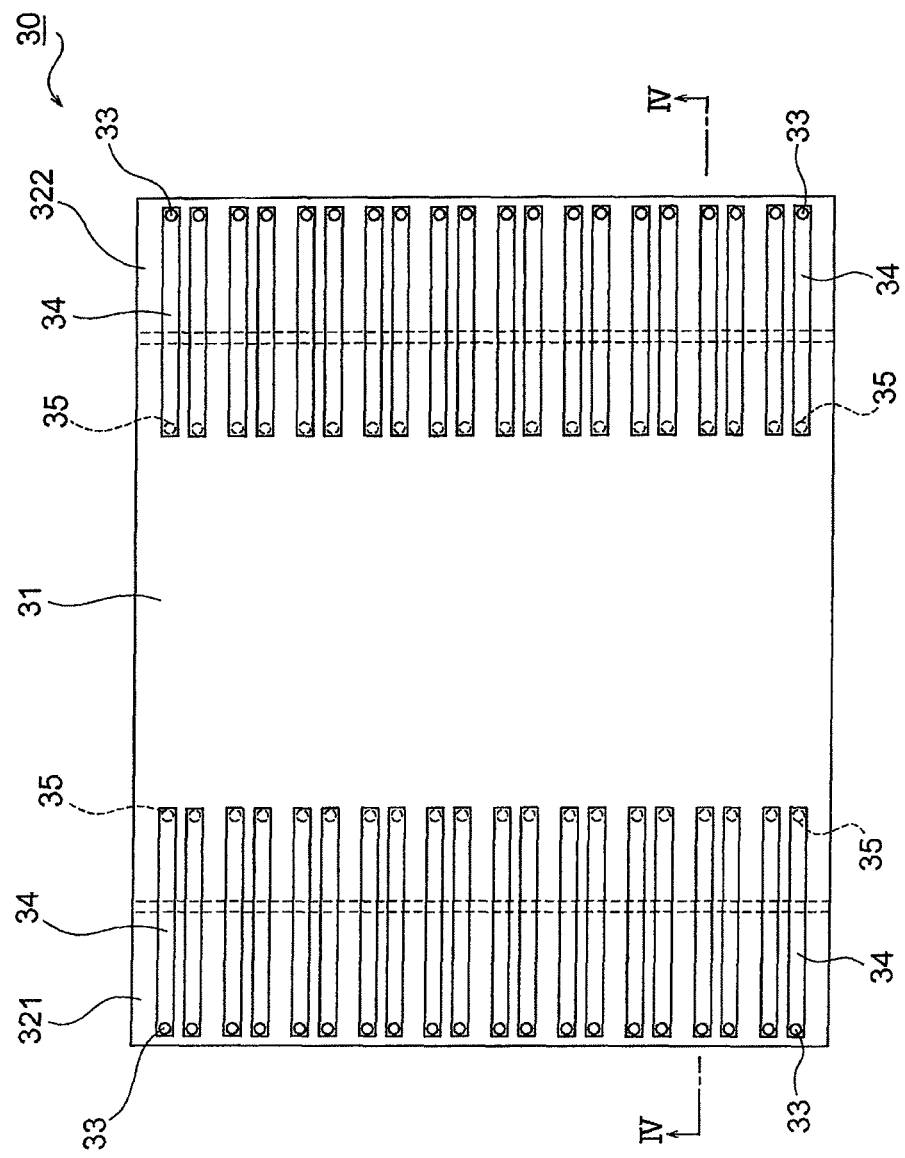
FIG. 3 is a plan view of a probe chip in the first embodiment of the present invention.
Figure 4:
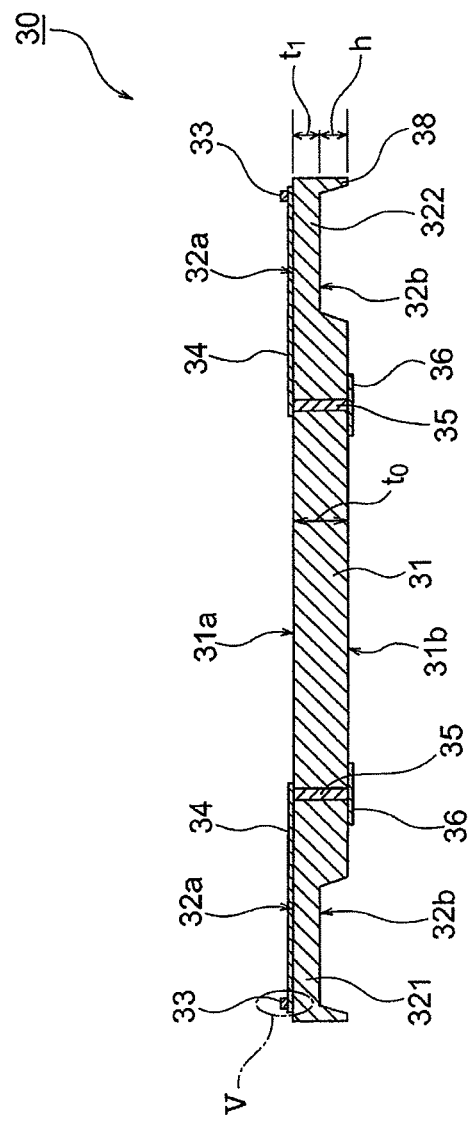
FIG. 4 is a cross-sectional view along line IV-IV shown in FIG. 3.
Figure 5:
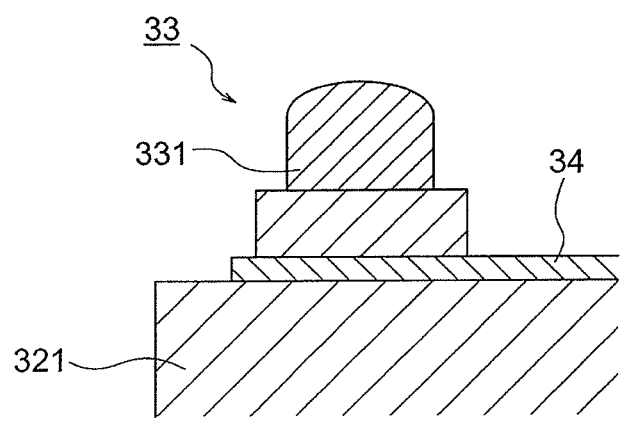
FIG. 5 is an enlarged view of section V shown in FIG. 4.
Figure 6:
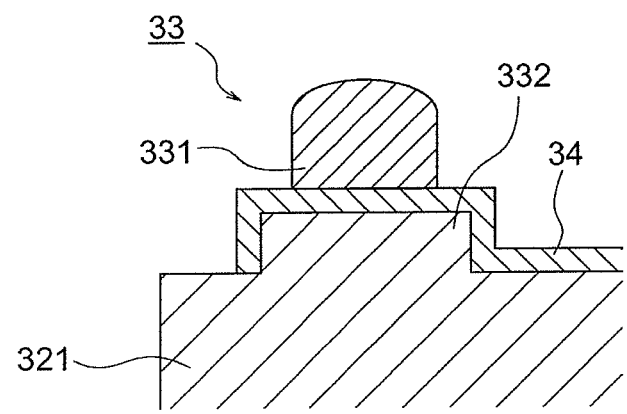
FIG. 6 is a cross-sectional view illustrating a modified form of the bump in the first embodiment of the present invention.
Figure 7:
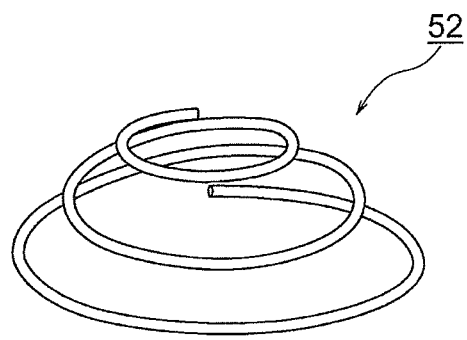
FIG. 7 is a perspective view illustrating a connecting member in the first embodiment of the present invention.

FIG. 3 and FIG. 4 are views illustrating the probe chip in the present embodiment. FIG. 5 is a view illustrating a bump in the present embodiment, FIG. 6 is a view illustrating a modified form of the bump, and FIG. 7 is a view illustrating a connecting member in the present embodiment. Note that, in FIG. 4, the probe chip 30 is illustrated as being vertically reversed compared to FIG. 1 and FIG. 2.

Each probe chip 30 acts as a contactor (contacting element) to contact with the electrodes 110 of the semiconductor wafer 100. This probe chip 30 is formed through processing a silicon substrate using semiconductor fabrication technique such as photolithography, and dividing it into a plurality of individual pieces. The probe chip 30 has a main body portion 31 and a pair of thin portions 321 and 322, as shown in FIG. 3 and FIG. 4.

The main body portion 31 is located at the middle of the probe chip 30 and has a certain thickness $t_0$. On the other hand, both the pair of thin portions 321 and 322 extend from respective ends of the main body portion 31, and each has a relatively smaller thickness $t_1$ than that of the main body portion 31 ($t_1 < t_0$). Further, bumps 33 are formed on upper surfaces 32a of the thin portions 321 and 322 in the present embodiment. On the other hand, projecting portions 38 are formed on lower surfaces 32b of the thin portions 321 and 322 in the vicinities of respective positions opposite to the bumps 33 (at free ends of the thin portions 321 and 322). Alternatively, the projecting portions 38 may be provided just at the positions opposite to the bumps 33 (i.e. in the vicinities of the free ends of the thin portions 321 and 322).

Each of these projecting portions 38 has a height h and projects in the opposite direction to each bump 33 (that is, toward the pitch converting board 40). In the present embodiment, the sum of the thickness $t_1$ of the thin portions 321 and 322 and the height h of the projecting portions 38 is substantially equal to the thickness $t_0$ of the main body portion 31 ($t_0 = t_1 + t$). These projecting portions 38 act as stoppers for elastic deformation of the thin portions 321 and 322 in order to prevent the thin portions 321 and 322 from being damaged due to unduly deformation. Note that, if the bumps 33 are desired to ensure larger strokes thereof, for example, then such projecting portions 38 may not be provided on the thin portions 321 and 322.

In the present embodiment, as shown in FIG. 4, upper surface 31a of the main body portion 31 and the upper surfaces 32a of the thin portions 321 and 322 are positioned at the same plane, while the lower surfaces 32b of the thin portions 321 and 322 is lower than the lower surface 31b of the main body portion 31. Such thin portions 321 and 322 may be formed through etching a silicon substrate to be a base of the probe chips 30. When being pressed, these thin portions 321 and 322 bend so as to ensure a certain elasticity of the probe chips 30.

In the present embodiment, the left-side thin portion 321 in FIG. 3 connects to the main body portion 31 at the rightmost end of the thin portion 321, while the leftmost end of the thin portion 321 is a free end. On the other hand, the right-side thin portion 322 in FIG. 3 connects to the main body portion 31 at the leftmost end of the thin portion 322, while the rightmost end of the thin portion 322 is a free end. Note that thin portions may be provided in four directions on the main body.

As shown in FIG. 3 and FIG. 4, a plurality of wiring patterns 34 are formed between the main body portion 31 and the vicinities of the free ends of the thin portions 321 and 322 and are composed of, for example, Cu or Au. Moreover, the above bumps 33 are formed on the respective thin portions 321 and 322 side ends of these wiring patterns 34.

Although, in the example shown in FIG. 3 and FIG. 4, the bumps 33 are provided in the vicinities of the free ends of the thin portions 321 and 322, the present invention is not particularly limited to this. The bumps 33 may be alternatively provided on the free ends of the thin portions 321 and 322.

As shown in FIG. 5, each bump 33 has a stepped convex shape and is formed through, for example, growing a Ni layer 331 by plating process. Alternatively, as shown in FIG. 6, a convex-like bump 33 may be formed through shaping a pedestal portion 332 from a silicon substrate to be a base of the probe chip 30 and growing thereon a Ni layer 331 by plating process. In the present embodiment, such a plurality of bumps 33 are arranged in a line near the free ends of the thin portions 321 and 322.

On the other hand, as shown in FIG. 3 and FIG. 4, TSVs 35 (silicon penetrating electrodes, or Through Silicon Vias) are formed to penetrate the main body portion 31 at the main body portion 31 side ends of the wiring patterns 34. For example, these TSVs 35 are Cu-filling-type ones which are filled therein with Cu. Further, pads 36 which are connected to these TSVs 35 are formed on the lower surface 31b of the main body portion 31. Although not particularly shown, for example, these pads 36 comprise three-layer of Cu/Ni/Au from the underlying layer.

Note that, the number and the arrangement of the bumps 33, the number and the shape of the wiring patterns 34, and the number and the arrangement of the TSVs 35 in FIG. 3 are illustrative only, and the present invention is not particularly limited to these. In addition, the wiring patterns 34 may be covered by surface protecting coating to ensure electrical insulation properties.

The bump 33 in the present embodiment is equivalent to one example of the contact portion in the present invention, the wiring pattern 34 in the present embodiment is equivalent to one example of the first interconnection in the present invention, the TSV 35 in the present embodiment is equivalent to one example of the first penetrating electrode in the present invention, and the pad 36 in the present embodiment is equivalent to one example of the first pad in the present invention.

The pitch converting board 40 is a silicon substrate which performs pitch conversion between the probe chips 30 and the performance board 50. Instead of a silicon substrate, this pitch converting board 40 may comprise, for example, a ceramic board, a silicon nitride substrate, a board inwoven with aramid fibers, a board obtained by laminating a core material with polyimide, such as core material of aramid fibers immersed with resin or core material of 42 alloy, a glass substrate, or an organic board, such as polyimide film board or liquid crystal polymer (LCP) film board.

As shown in FIG. 2, this pitch converting board 40 has a lower surface 401 (a surface on which the probe chips 30 are mounted) on which lower pads 41 are provided so as to correspond to respective pads 36 of the probe chips 30. Although not particularly shown, for example, these lower pads 41 comprise three-layer of Cu/Ni/Au likewise the above pads 36 of the probe chips 30. Further, TSVs 42 which penetrate the pitch converting board 40 open at the lower pads 41. For example, these TSVs 42 are side wall conductive type ones obtained by forming conductive layers on inner surfaces of penetrating holes.

This pitch converting board 40 also has an upper surface 402 (a surface which faces the performance board 50) on which upper pads 44 are provided so as to correspond to respective pads 51 of the performance board 50. These upper pads 44 are connected to the above-mentioned TSVs 42 via wiring patterns 43 composed of Cu or Au, for example.

In this pitch converting board 40, the pitch of the upper pads 44 is larger than the pitch of the lower pads 41 such that the pitch is enlarged (fanned out) by the pitch converting board 40. Although the pitch conversion is performed by means of the wiring patterns 43 formed on the upper surface 402 of the pitch converting board 40 in the example shown in FIG. 2, the present invention is not particularly limited to this. For example, the pitch converting board 40 may comprise a multilayer board and the pitch conversion is performed within the pitch converting board 40.

The lower pad 41 in the present embodiment is equivalent to one example of the second pad in the present invention, the TSV 42 in the present embodiment is equivalent to one example of the second penetrating electrode in the present invention, the wiring pattern 43 in the present embodiment is equivalent to one example of the second interconnection in the present invention, and the upper pad 44 in the present embodiment is equivalent to one example of the third pad in the present invention.

The performance board 50 is a circuit board composed of, for example, glass epoxy resin or the like. As shown in FIG. 2, the performance board 50 has a lower surface 501 (a surface which faces the pitch converting board 40) on which pads 51 are provided so as to correspond to respective upper pads 44 of the pitch converting board 40. These pads 51 are electrically connected to pin electronics accommodated in the test head 10 via wirings within the board 50 and connectors, cables and the like, not particularly shown.

In the present embodiment, connecting members 52 are provided on respective pads 51 of the performance board 50. As shown in FIG. 7, each connecting member 52 is a conical-shaped and spiral-like spring coil composed of a material having conductivity, and is elastically deformable in the axis direction thereof. This connecting member 52 is fixed to each pad 51 by means of, for example, soldering. The elastic deformation of this connecting member 52 ensures pressing force for establishing electrical conductivity between the pitch converting board 40 and the performance board 50, and absorbs positional errors of these boards 40 and 50.

Note that it is enough to interpose elastically deformable members having conductivity between the upper pads 44 of the pitch converting board 40 and the pads 51 of the performance board 50, and the present invention is thus not limited to the above. For example, a leaf spring having conductivity may be used as the connecting member. Moreover, connecting members 51 may be fixed to respective upper pads 44 of the pitch converting board 40 as substitute for the pads 51 of the performance board 50.

The pad 51 in the present embodiment is equivalent to one example of the fourth pad in the present invention, and the connecting member 52 in the present embodiment is equivalent to one example of the connecting member in the present invention.

Figure 8:
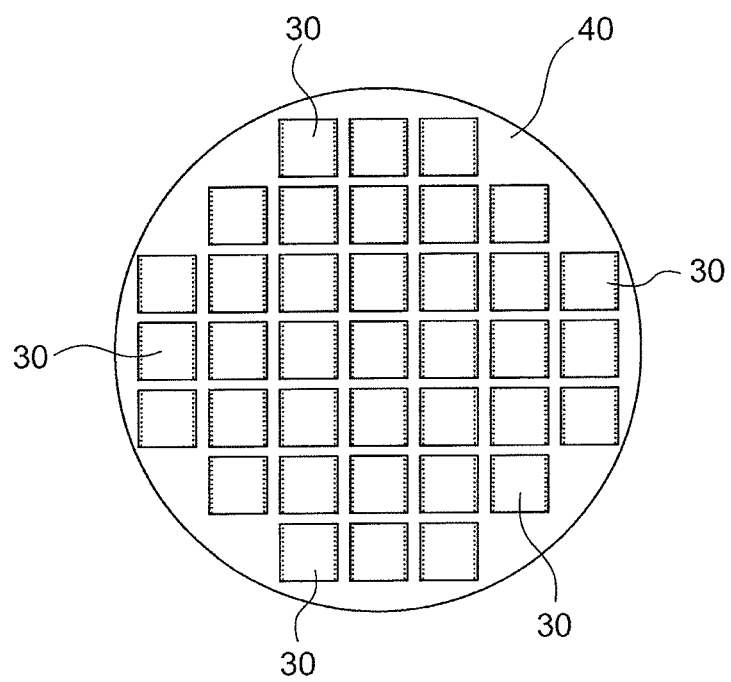
FIG. 8 is a view from below a pitch converting board on which probe chips are mounted in the first embodiment of the present invention.
Figure 9:
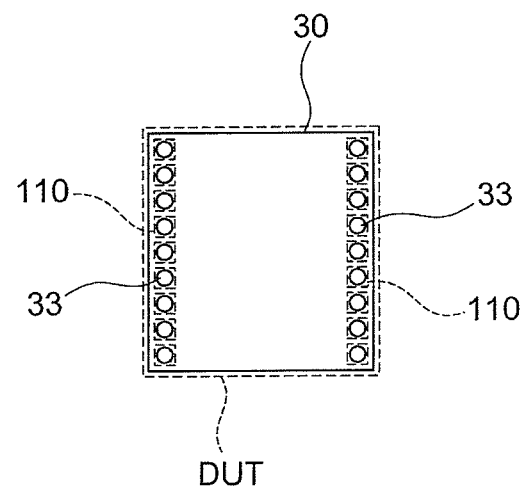
FIG. 9 is a plan view illustrating the correspondence relationship between each probe chip and each DUT in the first embodiment of the present invention.

FIG. 8 is a view from below the pitch converting board on which the probe chips are mounted in the present embodiment, and FIG. 9 is a plan view illustrating the correspondence relationship between each probe chip and each DUT in the present embodiment.

The pads 36 are fixed and electrically connected to the lower pads 41 such that the probe chips 30 as described above are mounted on the pitch converting board 40. At this time, the pads 36 and the lower pads 41 are fixed to one another such that a space may be formed between the projecting portions 38 of the probe chips 30 and the lower surface 401 of the pitch converting board 40 in order to accept the elastic deformation of the thin portions 321 and 322.

As specific examples of the fixing method for the pads 36 and the lower pads 41, for example, Transient Liquid Phase bonding (TLP bonding), in which bonding planes are temporarily molten so as to form intermetallic compounds, is mentioned. In this case, as examples of insert metal, In (indium) and the like is mentioned. Alternatively to TLP bonding, the pads 36 and the lower pads 41 may be bonded to one another using solder etc.

In the present embodiment, as shown in FIG. 8, a large number of probe chips 30 are mounted on single pitch converting board 40 so as to correspond to individual DUTs formed on a semiconductor wafer 100. That is, in the present embodiment, as shown in FIG. 9, one probe chip 30 has substantially the same dimension as one DUT and thus corresponds to one DUT. Moreover, in the present embodiment, one pitch converting board 40 has substantially the same dimension as the semiconductor wafer 100 and thus corresponds to one semiconductor wafer 100. Note that the number and the arrangement of the probe chips 30 which are mounted on single pitch converting board 40 are not particularly limited, and they may be arbitrarily set depending on the number and the arrangement of DUTs formed in the semiconductor wafer 100 under test.

Further, as shown in FIG. 1, cross-sectionally L-shaped angles 55 project downward from the performance board 50. The pitch converting board 40 is held at outer circumference thereof by these angles 55.

As shown in FIG. 1, the probe 20 configured as described above is electrically connected to the test head 10 via connectors or cables. Further, the test head 10 is electrically connected to a tester (a mainframe) via cables and the like. The test head 10 and/or the tester in the present embodiment are equivalent to one example of the testing apparatus main body in the present invention.

The moving apparatus 60 is provided below this probe 20. The moving apparatus 60 has: a stage 61 which holds the semiconductor wafer 100; and an arm 62 capable of moving the stage 61.

As shown in FIG. 1, a plurality of annular grooves 611 are formed on the surface of the stage 61 in a concentric fashion. A pathway 612 which is connected to the annular grooves 611 is formed inside the stage 61. This pathway 612 is further connected to a vacuum pump 65 via a pipe not particularly shown. Accordingly, when suction of the vacuum pump 65 are performed in a state where a semiconductor wafer 100 is placed on the stage 61, the semiconductor wafer 100 are adsorbed and held on the stage 61 by the negative pressure generated in the annular grooves 611.

The arm 62 has a motor, a ball screw mechanism and the like and can move the stage 61 in three-dimensions and rotate it around the vertical axis. Thus it is possible to move the semiconductor wafer 100 to a position facing the probe 20 and then to press the semiconductor wafer 100 against the probe 20.

Figure 10:
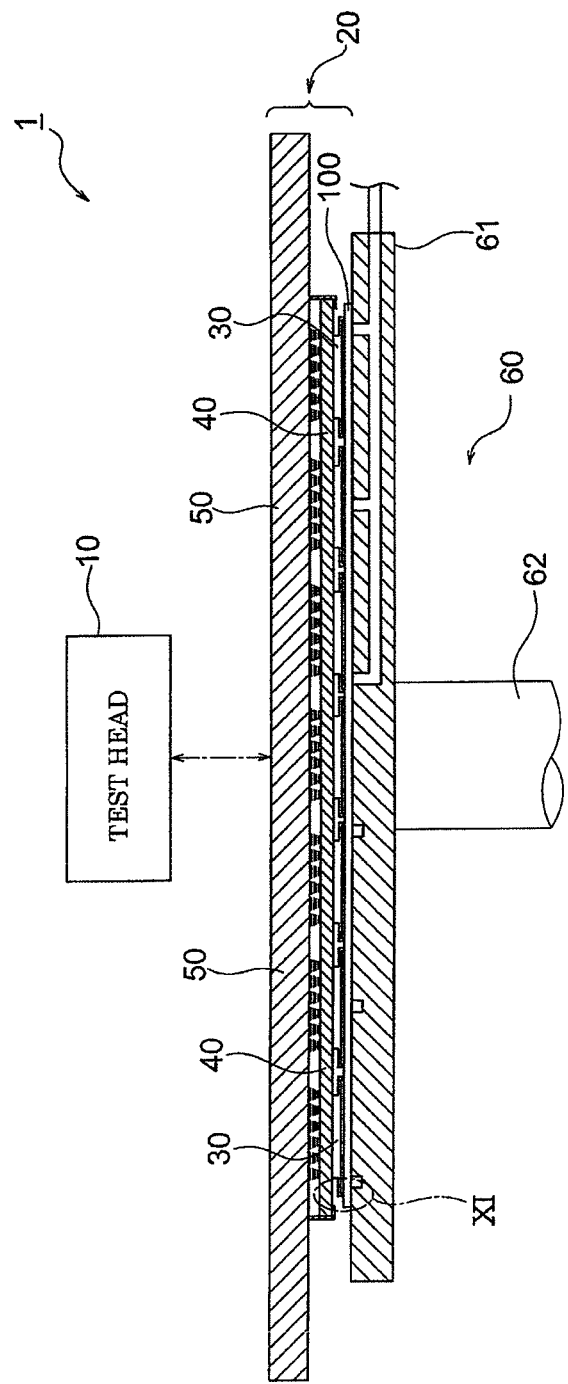
FIG. 10 is a schematic cross-sectional view illustrating a condition where the semiconductor wafer testing apparatus tests DUTs in the first embodiment of the present invention.
Figure 11:
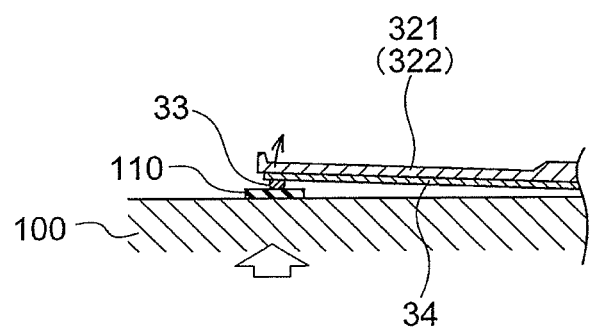
FIG. 11 is an enlarged cross-sectional view of section XI shown in FIG. 10.

FIG. 10 is a view illustrating a condition where the semiconductor wafer testing apparatus tests DUTs in the present embodiment, and FIG. 11 is an enlarged cross-sectional view of section XI shown in FIG. 10.

As shown in FIG. 10, when the moving apparatus 60 causes the semiconductor wafer 100 to face the probe 20 and also lifts up the stage 61, then the semiconductor wafer 100 on the stage 61 is pressed against the probe 20 and, as shown in FIG. 11, the bumps 33 of the probe chips 30 come to contact with the electrodes 110 of the semiconductor wafer 100. In this state, testing signals are input and output between the test head 10 and DUTs, thereby testing the DUTs.

At this time, in the present embodiment, as shown in the same figure, the thin portions 321 and 322 of the probe chips 30 bend to ensure elasticity of the probe chips 30. Due to this, no anisotropic conductive rubber is necessary to the probe 20 and it is also possible to reduce the number of layers in the probe 20, thereby improving the test accuracy and the connection reliability.

Further, in the present embodiment, one of the probe chips 30 which is mounted on the pitch converting board 40 corresponds to one of DUTs which is formed in the semiconductor wafer 100, and therefore each of the probe chips 30 may be individually exchangeable. Due to this, it is possible to reduce the cost in comparison with the conventional membrane having the single sheet on which a large number of bumps are formed.

Second Embodiment

Figure 12:
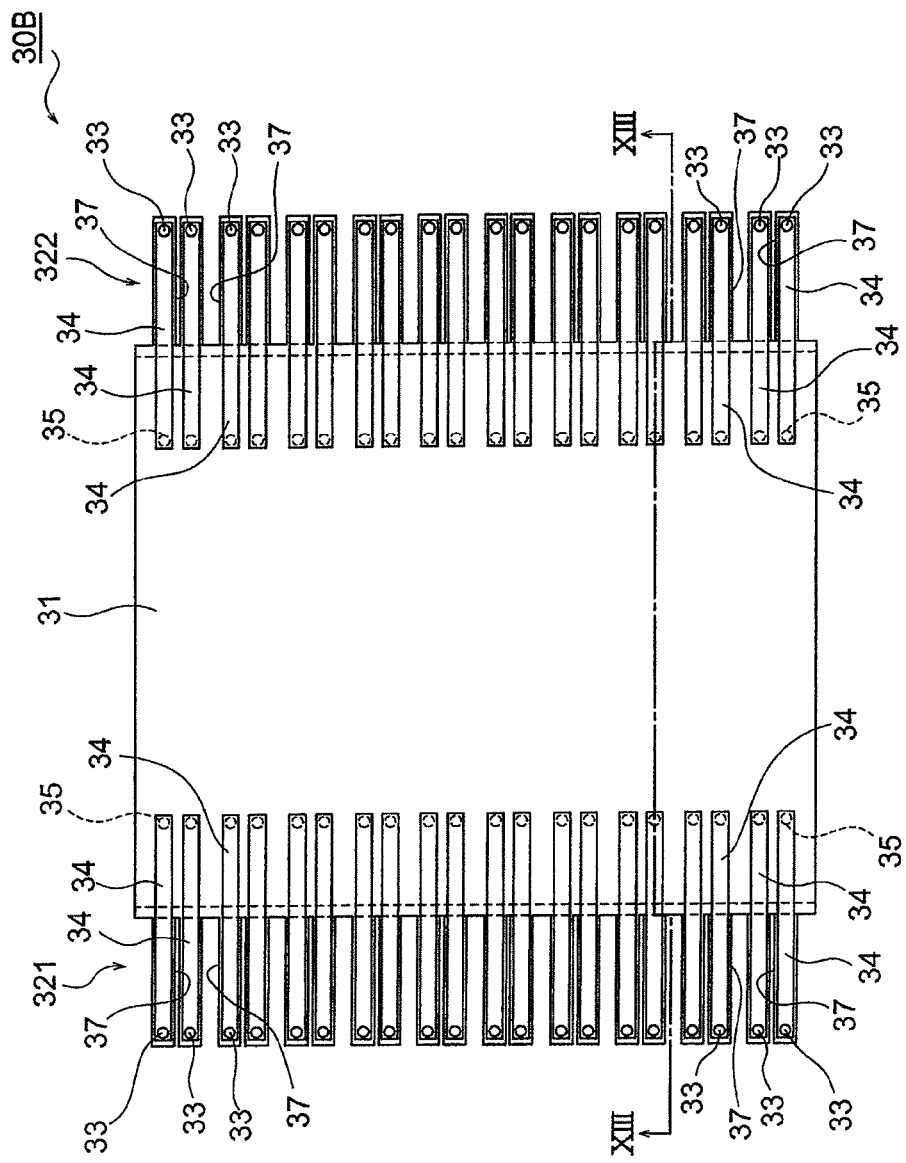
FIG. 12 is a plan view illustrating a probe chip in the second embodiment of the present invention.
Figure 13:
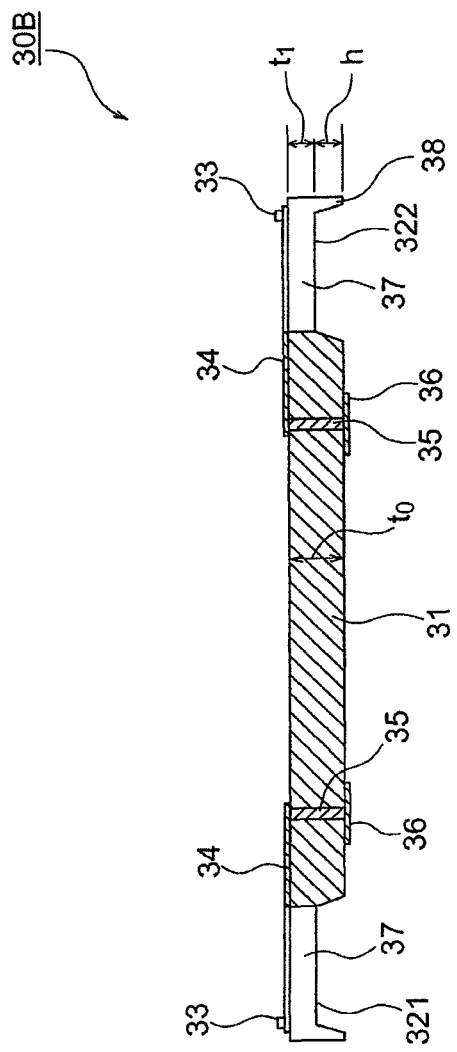
FIG. 13 is a cross-sectional view along line XIII-XIII shown in FIG. 12.

FIG. 12 and FIG. 13 are views illustrating a probe chip in the second embodiment of the present invention. While the present embodiment differs from the first embodiment in the configuration of a probe chip 30B, the remaining configuration is similar to the first embodiment. Hereinafter, the difference from the first embodiment will only be described with respect to the probe chip 30B in the second embodiment, and components having similar configuration as the first embodiment will be omitted to be described by denoting the same reference numerals.

As shown in FIG. 12 and FIG. 13, the probe chip 30B in the present embodiment has slits 37 along the wiring patterns 34 and each slit 37 is formed between each adjacent two wiring patterns 34 in the thin portions 321 and 322. That is, the thin portions 321 and 322 are formed into comb-like shape by these slits 37 so as to isolate respective bumps 33 from one another.

In the present embodiment, likewise the first embodiment, the thin portions 321 and 322 bend to ensure elasticity of the probe chips 30B. Due to this, no anisotropic conductive rubber is necessary to the probe 20 and it is also possible to reduce the number of layers in the probe 20, thereby improving the test accuracy and the connection reliability.

Moreover, in the present embodiment, since one of the probe chips 30B which is mounted on the pitch converting board 40 corresponds to one of DUTs which is formed in the semiconductor wafer 100, each of the probe chips 30B may be individually exchangeable. Due to this, it is possible to reduce the cost in comparison with the conventional membrane.

Furthermore, in the present embodiment, the slits 37 may provide an independent suspension mechanism for the plurality of bumps 33, thereby it is also possible to absorb variations in the height of the semiconductor wafer 100 or the electrodes 110.

Third Embodiment

Figure 14:
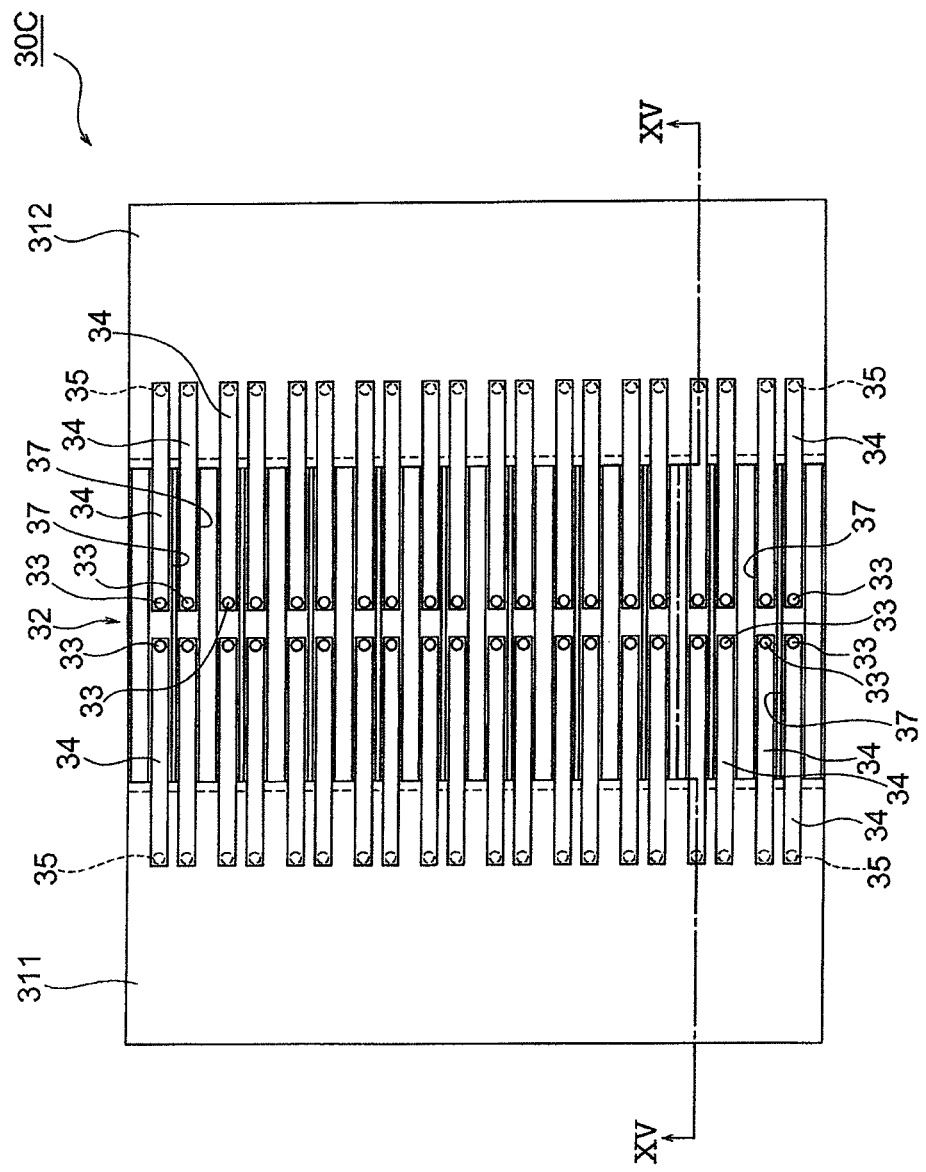
FIG. 14 is a plan view illustrating a probe chip in the third embodiment of the present invention.
Figure 15:
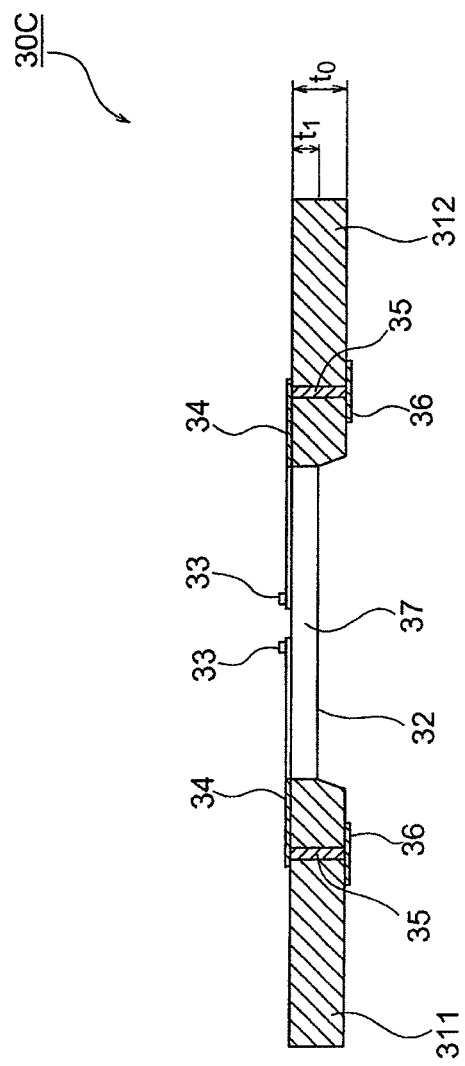
FIG. 15 is a cross-sectional view along line XV-XV shown in FIG. 14.
Figure 16:
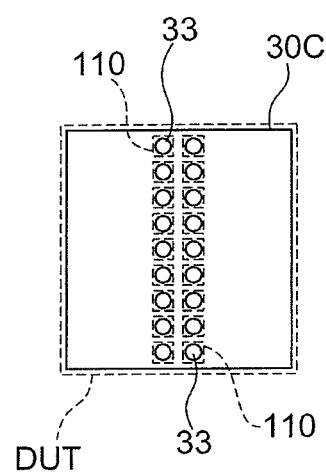
FIG. 16 is a plan view illustrating the correspondence relationship between each probe chip and each DUT in the third embodiment of the present invention.
Figure 17:
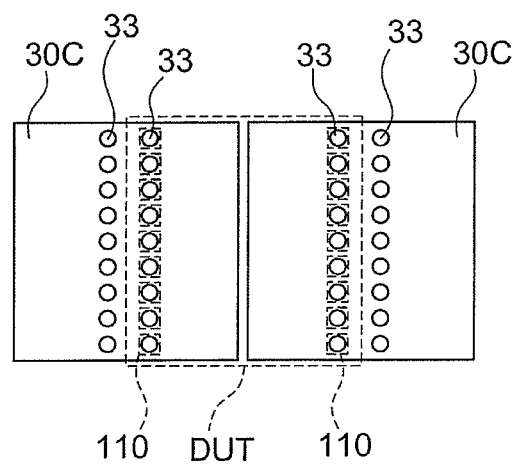
FIG. 17 is a plan view illustrating a modified version of the correspondence relationship between probe chips and a DUT in the third embodiment of the present invention.
Figure 18:
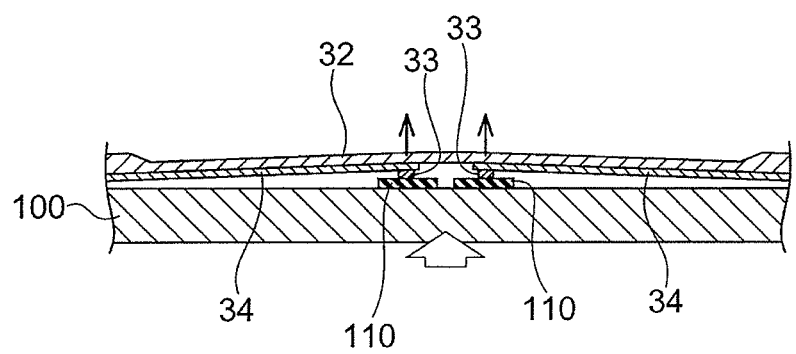
FIG. 18 is an enlarged cross-sectional view illustrating a condition where DUTs are tested using the probe chips shown in FIG. 14 and FIG. 15.

FIG. 14 and FIG. 15 are view illustrating a probe chip in the third embodiment of the present invention, FIG. 16 is a view illustrating the correspondence relationship between each probe chip and each DUT in the present embodiment, FIG. 17 is a view illustrating a modified version of the correspondence relationship between probe chips and a DUT, and FIG. 18 is a view illustrating a condition where DUTs are tested using the probe chips shown in FIG. 14 and FIG. 15.

While the present embodiment differs from the first embodiment in the configuration of a probe chip 30C, the remaining configuration is similar to the first embodiment. Hereinafter, the difference from the first embodiment will only be described with respect to the probe chip 30C in the third embodiment, and components having similar configuration as the first embodiment will be omitted to be described by denoting the same reference numerals.

The probe chip 30C as shown in FIG. 14 and FIG. 15 has a pair of main body portions 311 and 312 and a thin portion 32. The thin potion 32 is located between the main body portions 311 and 312.

Likewise the first embodiment, respective main body portions 311 and 312 have a certain thickness $t_0$, while the thin portion 32 has a relatively smaller thickness $t_1$ than that of the main body portions 311 and 312 ($t_1 < t_0$).

The thin portion 32 extends between respective main body portions 311 and 312 while connecting to the rightmost end of the left-side main body 311 in FIG. 14 and connecting to the leftmost end of the right side main body 312 in FIG. 14. Therefore, the thin portion 32 has both ends which are fixed ends and does not have free ends likewise the thin portions 321 and 322 of the first embodiment.

A plurality of wiring patterns 34 are formed between the vicinities of the middle of the thin portion 32 and respective main body portions 311 and 312. And respective bumps 33 are formed on the thin portion 32 side ends of these wiring patterns 34. In the present embodiment, a large number of such bumps 33 are arranged along two lines at the middle of the thin portion 32. Consequently, in the present embodiment, as shown in FIG. 16, one probe chip 30C may deal with a device, such as a DRAM, which has electrodes arranged at the middle thereof. In contrast, for a device which has electrodes arranged at both ends thereof, as shown in FIG. 17, a plurality of (e.g. two) probe chips 30C will deal with the device.

Note that, in the example as shown in FIG. 14 and FIG. 15, since the bumps 33 are arranged along two lines, individual bumps 33 are placed in the vicinities of the middle of the thin portion 32. On the other hand, if the bumps 33 are arranged along one line, these bumps 33 will be placed at the middle of the thin portion 32. Although the probe chip 30C as shown in FIG. 15 fails to comprise projecting portions 38, one or more projecting portions 38 may be provided on the thin portion 32 in order to prevent the thin portion 32 from being damaged due to unduly deformation.

Furthermore, in the present embodiment, as shown in FIG. 14 and FIG. 15, slits 37 along the wiring patterns 34 are formed between the wiring patterns 34 in the thin portion 32. Adjacent bumps 33 are isolated from each other by each of these slits 37 in a direction substantially orthogonal to the extending direction of the wiring patterns 34. Note that, likewise the first embodiment, slits 37 may be not formed in the thin portion 32 of the probe chip 30C in the present embodiment.

In the test of DUTs using the probe chip 30C as described above, when the semiconductor wafer 100 are pressed against the probe 20 by the moving apparatus 60, the bumps 33 of the probe chip 30C contact with the electrodes 110 of the semiconductor wafer 100.

At this time, in the present embodiment, as shown in FIG. 18, because the both ends of the thin portion 32 are fixed to the main body portions 311 and 312, the bumps 33 move along vertical direction due to the contact with the electrodes 110. Thereby preventing the contact portions at which the electrodes 110 and the bumps 33 contact with each other from slidably shifting, and especially the present embodiment is effective in the case of a narrow pitch. Note that, in the example of cantilever arm configuration as shown in FIG. 11, the displacement of the bumps 33 due to the contact with the electrodes 110 is in circular arc fashion.

As described above, in the present embodiment, the thin portion 32 bends to ensure elasticity of the probe chips 30C. Due to this, no anisotropic conductive rubber is necessary to the probe 20 and it is also possible to reduce the number of layers in the probe 20, thereby improving the test accuracy and the connection reliability.

Moreover, in the present embodiment, since one of the probe chips 30C which is mounted on the pitch converting board 40 corresponds to one of DUTs which is formed in the semiconductor wafer 100, each of the probe chips 30C may be individually exchangeable. Due to this, it is possible to reduce the cost in comparison with the conventional membrane.

Furthermore, in the present embodiment, the slits 37 may provide an independent suspension mechanism for the plurality of bumps 33, thereby it is also possible to absorb variations in the height of the semiconductor wafer 100 or the electrodes 110.

It is to be noted that the embodiments as explained above are described to facilitate understanding of the present invention and are not described to limit the present invention. Therefore, it is intended that the elements disclosed in the above embodiments include all design changes and equivalents to fall within the technical scope of the present invention.

DESCRIPTION OF REFERENCE NUMERALS

1 . . . semiconductor wafer testing apparatus
10 . . . test head
20 . . . probe
30, 30B, 30C . . . probe chip
31, 311, 312 . . . main body portion
32, 321, 322 . . . thin portion
33 . . . bump
34 . . . wiring pattern
35 . . . TSV
36 . . . pad
37 . . . slit
38 . . . projecting portion
40 . . . pitch converting board
41 . . . lower pad
42 . . . TSV
43 . . . wiring pattern
44 . . . upper pad
50 . . . performance board
51 . . . pad
52 . . . connecting member
60 . . . moving apparatus
61 . . . stage
62 . . . arm
100 . . . semiconductor wafer
110 . . . electrode

The invention claimed is:

1. A test-use individual substrate which is used for testing a semiconductor wafer, comprising:
   a main body portion;
   a thin portion which extends from the main body portion and which is relatively thinner than the main body portion;
   a contact portion which has a first outwardly protruding shape projecting from a first surface of the thin portion; and
   a projecting portion which has a second outwardly protruding shape projecting from a second surface of the thin portion,
   wherein
   the first outwardly protruding shape and the second outwardly protruding shape protrude in opposite directions,
   a length of the first outwardly protruding shape is shorter than a length of the thin portion in an extending direction of the thin portion,
   a length of the second outwardly protruding shape is shorter than the length of the thin portion in the extending direction of the thin portion,
   the thin portion connects to the main body portion at one end of the thin portion and other end of the thin portion is a free end,
   the test-use individual substrate comprises a plurality of the contact portions, and
   the thin portion has a slit formed between the contact portions.

2. A test-use individual substrate which is used for testing a semiconductor wafer, comprising:
   a main body portion;
   a thin portion which extends from the main body portion and which is relatively thinner than the main body portion;
   a contact portion which has a first outwardly protruding shape projecting from a first surface of the thin portion;
   a projecting portion which has a second outwardly protruding shape projecting from a second surface of the thin portion;
   a first interconnection which is connected to the contact portion;
   a first penetrating electrode which is connected to the first interconnection and which penetrates the main body portion from one main surface of the main body portion to other main surface of the main body portion; and
   a first pad which is provided on the other main surface of the main body portion and which is connected to the first penetrating electrode,
   wherein
   the first outwardly protruding shape and the second outwardly protruding shape protrude in opposite directions,
   a length of the first outwardly protruding shape is shorter than a length of the thin portion in an extending direction of the thin portion,
   a length of the second outwardly protruding shape is shorter than the length of the thin portion in the extending direction of the thin portion.

3. The test-use individual substrate as set forth in claim 2, wherein the thin portion connects to the main body portion at both ends of the thin portion.

4. The test-use individual substrate as set forth in claim 3, wherein
   the contact portion is placed at a middle of the thin portion or in the vicinity of the middle of the thin portion.

5. The test-use individual substrate as set forth in claim 3, comprising a plurality of the contact portions, wherein
   the thin portion has a slit formed between the contact portions.

6. A probe comprising:
   a plurality of test-use individual substrates; and
   a main board on which the test-use individual substrates are mounted,
   wherein
   each of the test-use individual substrates comprises:
   a main body portion;
   a thin portion which extends from the main body portion and which is relatively thinner than the main body portion;
   a contact portion which has a first outwardly protruding shape projecting from a first surface of the thin portion; and
   a projecting portion which has a second outwardly protruding shape projecting from a second surface of the thin portion,
   the first outwardly protruding shape and the second outwardly protruding shape protrude in opposite directions, a length of the first outwardly protruding shape is shorter than a length of the thin portion in an extending direction of the thin portion, a length of the second outwardly protruding shape is shorter than the length of the thin portion in the extending direction of the thin portion, the test-use individual substrate includes a first pad which is provided on the main body portion and which is electrically connected to the contact portion, the main board includes a second pad which is provided on one main surface of the main board, and the first pad is fixed and electrically connected to the second pad.

7. The probe as set forth in claim 6, wherein
one of the test-use individual substrates corresponds to one electronic device of a plurality of electronic devices formed in the semiconductor wafer.

8. The probe as set forth in claim 6, wherein
the main board comprises:
a second penetrating electrode which is connected to the second pad and which penetrates the main board from the one main surface of the main board to other main surface of the main board;
a second interconnection which is provided on the other main surface of the main board and which is connected to the second penetrating electrode; and
a third pad which is connected to the second interconnection.

9. The probe as set forth in claim 8, wherein
the probe further comprises a wiring board on which the main board is stacked,
the wiring board has a fourth pad at a position corresponding to the third pad of the main board, and
a connecting member which is elastically deformable and which has conductivity is interposed between the third pad and the fourth pad.

10. A semiconductor wafer testing apparatus for testing a semiconductor wafer, comprising:
the probe as set forth in claim 6;
a testing apparatus main body which is electrically connected to the probe; and
a connecting device which electrically connects the contact portion of the probe and an electrode of the semiconductor wafer.

11. The probe as set forth in claim 6, wherein
a sum of a thickness of the thin portion and a height of the projecting portion is substantially equal to a thickness of the main body portion, and
the first pad and the second pad are fixed to each other so that a space is formed between the projecting portion and the one main surface of the main board in order to accept the elastic deformation of the thin portion.

12. The probe as set forth in claim 6, comprising a pair of the thin portions which protrude from both ends of the main body in opposite directions.

* * * * *